(12) United States Patent
Kang et al.

(10) Patent No.: US 9,863,752 B2
(45) Date of Patent: Jan. 9, 2018

(54) METROLOGY APPARATUS FOR A SEMICONDUCTOR PATTERN, METROLOGY SYSTEM INCLUDING THE SAME AND METROLOGY METHOD USING THE SAME

(71) Applicant: SK hynix Inc., Gyeonggi-do (KR)

(72) Inventors: Yoon Shik Kang, Gyeonggi-do (KR);
Seong Min Ma, Gyeonggi-do (KR);
Joon Seong Hahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 174 days.

(21) Appl. No.: 14/950,174

(22) Filed: Nov. 24, 2015

(65) Prior Publication Data

US 2017/0038194 A1 Feb. 9, 2017

(30) Foreign Application Priority Data

Aug. 7, 2015 (KR) .................... 10-2015-0111781

(51) Int. Cl.
| | |
|---|---|
| *G01B 9/02* | (2006.01) |
| *G02B 27/28* | (2006.01) |
| *G02B 5/30* | (2006.01) |
| *G02F 1/01* | (2006.01) |
| *H01L 21/66* | (2006.01) |

(52) U.S. Cl.
CPC ........ *G01B 9/02011* (2013.01); *G02B 5/3083* (2013.01); *G02B 27/286* (2013.01); *G02F 1/0136* (2013.01); *G01B 2210/56* (2013.01); *G01B 2290/70* (2013.01); *H01L 22/12* (2013.01)

(58) Field of Classification Search
CPC ..................... G01B 9/02011; G01B 2210/56
See application file for complete search history.

(56) References Cited

U.S. PATENT DOCUMENTS

| | | | | |
|---|---|---|---|---|
| 9,182,581 | B2* | 11/2015 | Sato | G02B 21/0092 |
| 2012/0236315 | A1* | 9/2012 | Levy | G01B 9/02004 |
| | | | | 356/491 |
| 2013/0265576 | A1* | 10/2013 | Acher | G01J 4/00 |
| | | | | 356/369 |
| 2013/0342768 | A1* | 12/2013 | Yokoyama | G02F 1/1313 |
| | | | | 349/1 |
| 2017/0016835 | A1* | 1/2017 | Barak | G01N 21/956 |

FOREIGN PATENT DOCUMENTS

KR 1020100085595 7/2010

* cited by examiner

*Primary Examiner* — Shawn Decenzo
(74) *Attorney, Agent, or Firm* — IP & T Group LLP

(57) ABSTRACT

A metrology method includes obtaining a pattern reflection light reflected from an object by irradiating a first divided light, which is generated by reflecting a polarized light, to the object; obtaining a phase-controlled mirror reflection light reflected from a reflector by irradiating a second divided light, which is generated by transmitting the polarized light, to the reflector; and obtaining a pattern of the object based on an interference signal between the pattern reflection light and the mirror reflection light.

27 Claims, 3 Drawing Sheets

METROLOGY APPARATUS FOR A SEMICONDUCTOR PATTERN, METROLOGY SYSTEM INCLUDING THE SAME AND METROLOGY METHOD USING THE SAME

CROSS-REFERENCES TO RELATED APPLICATION

The present application claims priority under 35 U.S.C. §119(a) to Korean application number 10-2015-0111781, filed on Aug. 7, 2015, in the Korean Intellectual Property Office, which is incorporated herein by reference in its entirety.

BACKGROUND

1. Technical Field

Various embodiments generally relate to a metrology apparatus for a semiconductor integrated circuit, more particularly, to a metrology apparatus for a semiconductor pattern, a metrology system including the same, and a metrology method using the same.

2. Related Art

As a semiconductor integrated circuit may have been highly integrated, a line width, a critical dimension, etc., of a semiconductor device may be continuously reduced.

Recently, a semiconductor device having a three-dimensional structure are being developed. Thus, the semiconductor integrated circuit may include a pattern having a high aspect ratio.

While fabricating the semiconductor integrated circuit an inspection may be made for detecting fabrication failure or pattern failure of the semiconductor integrated circuit by measuring the thickness and/or the width of each layer and/or the pattern formed by each stage of the fabrication.

The pattern failure may be determined based on whether the measured data falls within an allowable range. When the pattern is determined as abnormal, the pattern failure may be prevented by changing process parameters.

Apparatus for inspecting the pattern in the semiconductor integrated circuit are developed and studied. An optical measurement method may be a typical method for inspecting the pattern. In the optical measurement method, an optical signal may be irradiated to an object. An optical signal reflected from the object may be analyzed to determine the pattern failure.

However, as the semiconductor integrated circuit has a narrower pitch and a higher aspect ratio, it is required to develop a metrology method for measuring a pattern having a pitch less than a wavelength of a light source used for the optical measurement.

SUMMARY

According to an exemplary embodiment of the present disclosure, a metrology method may include: obtaining a pattern reflection light reflected from an object by irradiating a first divided light, which is generated by reflecting a polarized light, to the object; obtaining a phase-controlled mirror reflection light reflected from a reflector by irradiating a second divided light, which is generated by transmitting the polarized light, to the reflector; and obtaining a pattern of the object based on an interference signal between the pattern reflection light and the mirror reflection light.

According to an exemplary embodiment of the present disclosure, a metrology apparatus may include a light source suitable for emitting a light; a first polarizer suitable for generating a polarized light by polarizing the emitted light; a beam splitter suitable for dividing the polarized light into a first divided light and a second divided light; a second polarizer suitable for generating a pattern reflection light by polarizing the first divided light and irradiating the polarized first divided light to an object; a reflector suitable for generating a mirror reflection light by reflecting the second divided light; a wavelength plate suitable for controlling a phase of the mirror reflection light; a detector suitable for changing a polarization characteristic of an interference signal between the pattern reflection light and the mirror reflection light; and an image obtainer suitable for obtaining a pattern of the object based on the interference signal outputted from the detector.

According to an exemplary embodiment of the present disclosure, a metrology system may include a metrology apparatus suitable for: obtaining a pattern reflection light reflected from an object by irradiating a first divided light, which is generated by reflecting a polarized light, to the object; obtaining a phase-controlled mirror reflection light reflected from a reflector by irradiating a second divided light, which is generated by transmitting the polarized light, to the reflector; and obtaining a pattern of the object based on an interference signal between the pattern reflection light and the mirror reflection light; a stage suitable for moving the object; and a user device suitable for controlling the metrology apparatus and the stage to measure the pattern of the object based on operational parameters.

BRIEF DESCRIPTION OF THE DRAWINGS

Example embodiments can be understood in more detail from the following detailed description taken in conjunction with the accompanying drawings.

FIG. 1 is a block diagram illustrating a metrology apparatus for a semiconductor pattern in accordance with an exemplary embodiment of the present disclosure;

FIG. 2 is a block diagram illustrating a metrology system for a semiconductor pattern in accordance with an exemplary embodiment of the present disclosure;

FIG. 3 is a block diagram illustrating a user device of FIG. 2; and

FIG. 4 is a flow chart illustrating a metrology method of the metrology system in accordance with an exemplary embodiment of the present disclosure.

DETAILED DESCRIPTION

Figure 1:
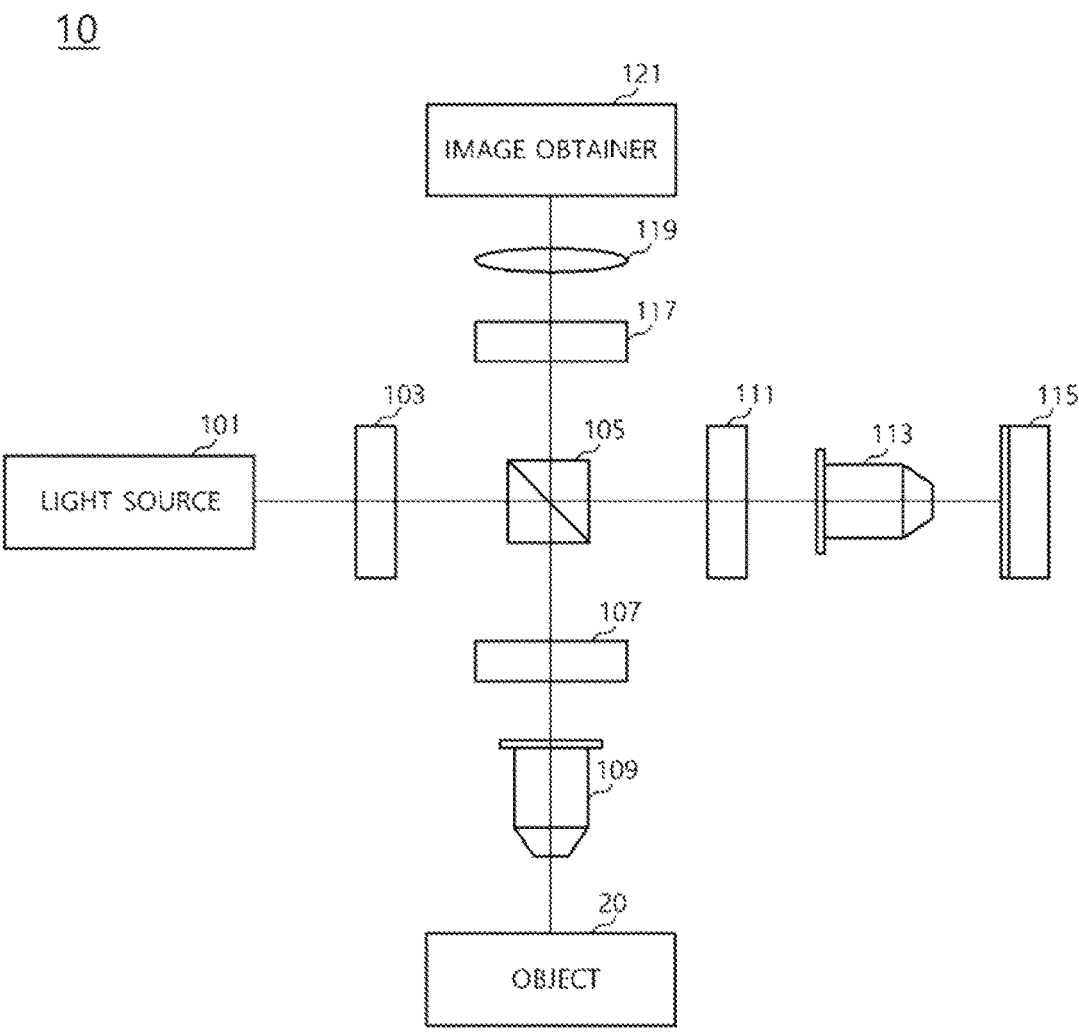
FIGS. 1 to 4 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example of manufacturing techniques and/or tolerances are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram illustrating a metrology apparatus 10 for a semiconductor pattern in accordance with an exemplary embodiment of the present disclosure.

Referring to FIG. 1, the metrology apparatus 10 may include a light source 101, a first polarizer 103, a beam splitter 105, a second polarizer 107, a first objective lens 109, a wavelength plate 111, a second objective lens 113, a reflector 115, a detector 117, a condenser 119 and an image obtainer 121.

The light source 101 may irradiate a light to an object 20. The light may include a coherent light. The coherent light may include two light waves having a same frequency and uniform phase difference to mutually interfere with each other. Alternatively, the light may include an incoherent light.

When a semiconductor pattern has a pitch less than a wavelength of the light, it is impossible to obtain information of the semiconductor pattern through direct imaging. Thus, the information of the semiconductor pattern may be obtained by an interferometer measuring the phase of the semiconductor pattern. In various embodiments. The interferometer may include the coherent light source or the incoherent light source. The metrology apparatus 10 may measure the semiconductor pattern having the pitch less than the wavelength of the light irradiated from the light source 101.

The first polarizer 103 may form a polarized light by changing polarization characteristics of the light irradiated from the light source 101. In various embodiments, the first polarizer 103 may include a variable polarizer for changing the polarization characteristics. The first polarizer 103 may transmit a secondary wave (S wave) or a primary wave (P wave) in accordance with analysis modes of the object 20.

The beam splitter 105 may divide the polarized light into a first divided light and a second divided light. In various embodiments, the first divided light may include a reflection light reflected from the beam splitter 105. The second divided light may include a transmission light transmitting through the beam splitter 105.

The second polarizer 107 may irradiate the first divided light to the object 20 by changing polarization characteristics of the first divided light reflected from the beam splitter 105. In various embodiments, the second polarizer 107 may include a radial polarizer. The radial polarizer may convert a linear polarization light into a radial polarization light or an azimuthal polarization light. The radial polarizer may provide the linear polarization light having a small spot size by concentrating the linear polarization light. Thus the second polarizer 107 may be effectively used for measuring the pattern of the object having the pitch less than the wavelength of the light.

In various embodiments, when the S wave is transmitted through the first polarizer 103, the S wave may be converted into a transverse electronic wave (TE wave) by the second polarizer 107. When the P wave is transmitted through the first polarizer 103, the P wave may be converted into a transverse magnetic wave (TM wave) by the second polarizer 107.

The first objective lens 109 may concentrate the light transmitting through the second polarizer 107 so that an image of the object 20 may be primarily formed on the image obtainer 121.

After the light is irradiated to the object 20 through the first objective lens 109, a pattern reflection light reflected from the object 20 may be incident to the first objective lens 109. The pattern reflection light may be incident to the second polarizer 107 to be converted into a linear polarization light. The linearly polarized pattern reflection light may then be incident to the beam splitter 105. In various embodiments, the pattern reflection light may be a measurement signal. The pattern reflection light or the measurement signal with or without polarization change by the object 20 may be incident to the beam splitter 105 through the second polarizer 107.

The wavelength plate 111 may transmit the second divided light transmitting through the beam splitter 105. The second divided light transmitting through the wavelength plate 111 may be incident to the reflector 115 through the second objective lens 113. A mirror reflection light reflected from the reflector 115 may be again incident to the wavelength plate 111. The mirror reflection light may be a reference signal.

In various embodiments, the wavelength plate 111 may include a quarter-wavelength plate. The wavelength plate 111 may have variable phase delay characteristics. Phase characteristics of the second divided light or the reference signal reflected from the reflector 115 may be controlled by the wavelength plate 111. When the phase delay of the wavelength plate 111 is be about 0°, the reference signal may have polarization characteristics substantially the same as those of the light irradiated from the first polarizer 103. When the wavelength plate 111 is rotated at an angle corresponding to a predetermined phase delay, the reference signal may have polarization characteristics different from those of the light irradiated from the first polarizer 103. In various embodiments, the rotation angle of the wavelength plate 111 may be set as about 22.5°. However, the rotation angle of the wavelength plate 111 may not be restricted within a specific number.

The first divided light reflected from the beam splitter 105 may be incident to the object 20. The pattern reflection light or the measurement signal reflected from the object 20 may be polarized or not polarized by the object 20. Thus, when the first polarizer 103 transmits the S wave and the phase delay of the wavelength plate 111 is about 0°, interference between the S waves of the measurement signal and the reference signal may occur at the beam splitter 105. In contrast, when the first polarizer 103 transmits the S wave, the pattern reflection light is reflected from the object 20 to the beam splitter 105, and the wavelength plate 111 is rotated at an angle corresponding to the predetermined phase delay, interference between the P waves of the measurement signal and the reference signal may occur at the beam splitter 105.

Similarly, when the first polarizer 103 transmits the P wave and the phase delay of the wavelength plate 111 is about 0°, interference between the P waves of the measurement signal and the reference signal may occur at the beam splitter 105. In contrast, when the first polarizer 103 transmits the P wave, the pattern reflection light is reflected from the object 20 to the beam splitter 105, and the wavelength plate 111 is rotated at an angle corresponding to the predetermined phase delay, such that interference between the S waves of the measurement signal and the reference signal may occur at the beam splitter 105.

The pattern reflection light or the measurement signal incident to the beam splitter 105 from the object 20 and the mirror reflection light or the reference signal incident to the beam splitter 105 from the reflector 115 may be irradiated to the detector 117.

The detector 117 may determine polarization characteristics in accordance with polarization modes to be analyzed. In various embodiments, the detector 117 may include a variable detector for changing the polarization characteristics.

When the polarization characteristics of the detector 117 is coincided with those of the first polarizer 103 and the wavelength plate 111 does not delay the phase of the mirror reflection light (e.g., the rotation angle of the wavelength plate 111 is about 0°), the image obtainer 121 may detect and photograph an image with respect to reflected components with the same polarization characteristics as those of the first polarizer 103. This may be referred to as a first metrology mode.

In contrast, when the polarization characteristics of the detector 117 is vertical to those of the first polarizer 103 and the wavelength plate 111 is rotated at an angle corresponding to the predetermined phase delay, the image obtainer 121 may detect and photograph an image with respect to reflected components with the vertical polarization characteristics to those of the first polarizer 103. This may be referred to as a second metrology mode.

According to an optical pattern measurement technology, when optical elements are complicatedly overlapped with each other, transitions of a light may be accurately represented by mathematically describing a polarized light. When an arrangement of the polarized light is represented as a matrix, polarization changes may be easily shown by simple matrix calculations. A typical example of the matrix may be the Jones Matrix.

In the Jones Matrix, diagonal components may indicate reflected components without polarization change and off-diagonal components may indicate reflected components with polarization change. Thus, the diagonal components may have the same polarization characteristics as those of the first polarizer 103. In contrast, the off-diagonal components may have the vertical polarization characteristics to those of the first polarizer 103.

In an exemplary embodiment of the present disclosure, the diagonal components without the changes of the polarization modes and the off-diagonal components with the changes of the polarization modes may be separately detected by controlling the first polarizer 103, the second polarizer 107, the wavelength plate 111 and the detector 117.

When the pattern image is measured simultaneously in a TE mode and a TM mode, it may be difficult to accurately analyze the measured pattern due to interference between two phase information. However, according to an exemplary embodiment of the present disclosure, the polarization characteristics of the light may be controlled and the interference between the pattern reflection light (i.e., the measurement signal) and the mirror reflection light (i.e., the reference signal) may be analyzed according to the polarization modes. As a result, the metrology apparatus may obtain reliable pattern analysis.

Moreover, when adopting the radial polarizer as the second polarizer 107, it is possible to measure an interference image to each of the TE mode and the TM mode. Therefore, information of the semiconductor pattern having a pitch less than a wavelength of the light irradiated from the light source 101 may be measured more precisely, and thus an ultra-fine pattern of the semiconductor integrated circuit may be easily measured.

Figure 2:
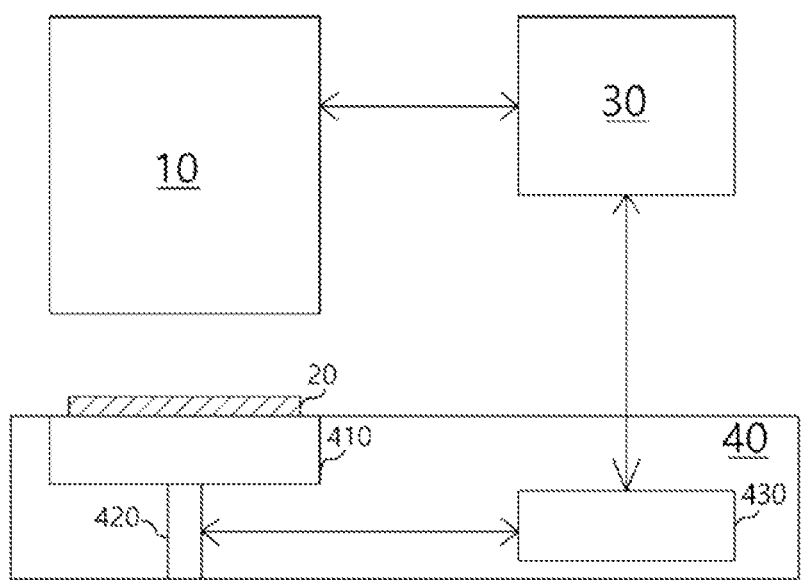

FIG. 2 is a block diagram illustrating a metrology system 300 for a semiconductor pattern in accordance with an exemplary embodiment of the present disclosure. FIG. 2 shows the metrology system 300 including the metrology apparatus 10 described with reference to FIG. 1.

Referring to FIG. 2, a metrology system 300 for a semiconductor pattern may include a user device 30, the metrology apparatus 10 and a stage 40.

The user device 30 may control operations of the metrology apparatus 10 and the stage 40 based on operational parameters such as commands, control signals, data, etc.

As described with reference to FIG. 1, the metrology apparatus 10 may obtain the pattern image of the object 20 based on the interference signal between the pattern reflection light (i.e., the measurement signal), which may be obtained by irradiating the first divided light to the object 20, and the mirror reflection light (i.e., the reference signal), which may be generated by reflecting the second divided light from the reflector 115. In various embodiments, the metrology apparatus 10 may measure phases of the interference signal between the pattern reflection light (i.e., the measurement signal) and the mirror reflection light (i.e., the reference signal) in accordance with polarized directions of the light irradiated from the light source 101 and phase delay of the reference signal. That is, the metrology apparatus 10 may separately measure the TE mode and the TM mode in accordance with polarizations of the pattern reflection light.

The stage 40 may include a supporting unit 410, a transferring unit 420 and a driving unit 430. The object 20 may be placed on the supporting unit 410.

The driving unit 430 may drive the transferring unit 420 under the control of the user device 30. In various embodiments, the driving unit 430 may move the transferring unit 420 in horizontal directions (i.e., X-Y directions) and/or a vertical direction (i.e., Z direction). When the driving unit 430 moves the transferring unit 420 in the vertical direction, the pattern image of the object 20 may be more accurately measured.

Figure 3:
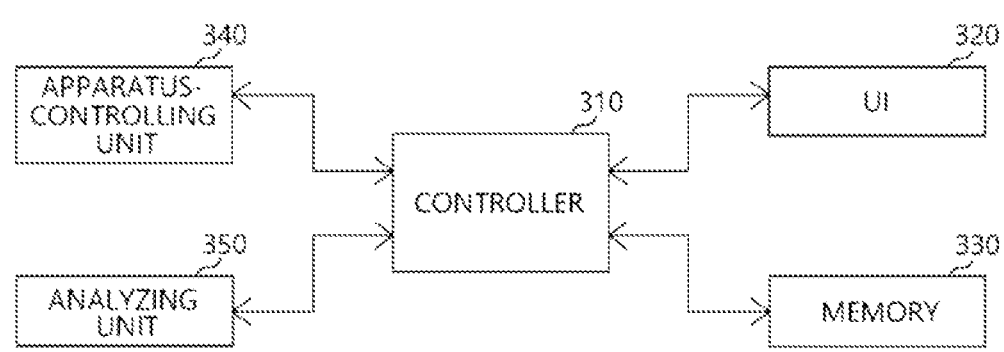

FIG. 3 is a block diagram illustrating the user device 30 of FIG. 2.

Referring to FIG. 3 the user device 30 may include a controller 310, a user interface 320, a memory 330 an apparatus-controlling unit 340 and an analyzing unit 350.

The user interface 320 may include an input device and an output device. The user interface 320 may receive the operational parameters such as the commands, the data, etc., through the input device. The user interface 320 may output operation statuses, processing results, etc., of the metrology system 300 through the output device.

In various embodiments, the polarization characteristics of the first polarizer 103, the second polarizer 107 and the detector 117, the phase delay of the wavelength plate 111 and a driving power of the light source 101 according to metrology modes may be operational parameters to be inputted through the user interface 320. The metrology modes may include the first metrology mode for measuring the interference between the pattern reflection light (i.e., the measurement signal) and the mirror reflection light (i.e., the reference signal) having the same polarization characteristic, and the second metrology mode for measuring the interference between the pattern reflection light and the mirror reflection light having vertical polarization characteristics.

The memory 330 may include a main memory and an auxiliary memory. Programs for driving the metrology system 300, control data, application programs, the operational parameters, the processing results, etc., may be stored in the memory 330.

The apparatus-controlling unit 340 may control the operations of the metrology apparatus 10 and the stage 40. The apparatus-controlling unit 340 may control the polarization characteristics of the first polarizer 103, the second polarizer 107 and the detector 117 according to the metrology modes in response to the operational parameters. The apparatus-controlling unit 340 may control the phase delay of the wavelength plate 111 also in response to the operational parameters. The apparatus-controlling unit 340 may provide the light source 101 with a predetermined power also in response to the operational parameters. The apparatus-controlling unit 340 may control the driving unit 430 in accordance with the operational parameters to provide the transferring unit 420 with desired directions and velocities.

The analyzing unit 350 may analyze the pattern of the object 20 based on the information of the image obtained by the metrology apparatus 10.

In various embodiments, the analyzing unit 350 may analyze the pattern of the object 20 based on the image information of the first and second metrology modes separately obtained by the metrology apparatus 10. As mentioned above, the first metrology mode may measure the interference between the pattern reflection light and the mirror reflection light having the same polarization characteristic. The second metrology mode may measure the interference between the pattern reflection light and the mirror reflection light having the vertical polarization characteristics.

Because the metrology apparatus 10 may separately perform the first metrology mode and the second metrology mode, the analyzing unit 350 may gather the image information in each of the first and second metrology modes to measure the pattern of the object 20. In various embodiments, the analyzing unit 350 may use an analysis technique based on Jones Matrix. Alternatively, the analyzing unit 350 may use other analysis techniques.

Figure 4:
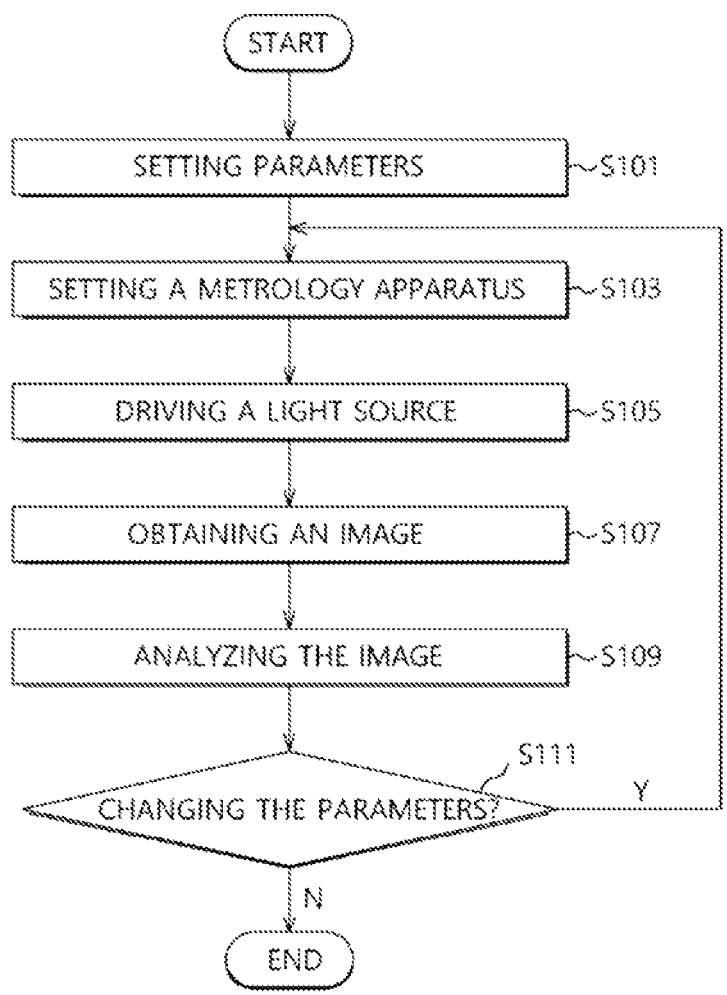

FIG. 4 is a flow chart illustrating a metrology method of the metrology system 300 in accordance with an exemplary embodiment of the present disclosure.

Referring to FIGS. 1 to 4, the object 20 may be placed on the supporting unit 410 of the stage 40.

At step S101, the operational parameters such as the polarization characteristics of the first polarizer 103, the second polarizer 107 and the detector 117, the phase delay of the wavelength plate 111, and the driving power of the light source 101 according to the metrology modes may be inputted through the user interface 320. The metrology modes may include the first metrology mode for measuring the interference between the measurement signal and the reference signal (i.e., the pattern reflection light and the mirror reflection light) having the same polarization characteristics, and the second metrology mode for measuring the interference between the measurement signal and the reference signal having vertical polarization characteristics.

At step S103, the metrology apparatus 10 may be set for one of the first and second metrology modes based on the operational parameters. For example, the metrology apparatus 10 may be set for the first metrology mode.

At step S105, the metrology apparatus 10 may drive the light source 105.

At step S107, the measurement signal, the reference signal and the interference signal may be generated based on the light emitted from the light source 101 as described with reference to FIG. 1. The image obtainer 121 may obtain the pattern of the object 20 based on the interference signal.

As described with reference to FIG. 1, the polarization characteristics of the light emitted from the light source 101 may be changed by the first polarizer 103 having the polarization characteristics in accordance with the operational parameters. For example, the first polarizer 103 may have the S wave polarization characteristic or the P wave polarization characteristic. The polarized light provided by the first polarizer 103 may be divided into the first divided light reflected from the beam splitter 105 and the second divided light transmitting through the beam splitter 105.

The first divided light may be converted into the radial polarized light by the second polarizer 107. When the S wave is transmitted through the first polarizer 103, the S wave may be converted into the radial polarized light having the TE mode by the second polarizer 107. The radial polarized light may be incident to the object 20 through the first objective lens 109. The pattern reflection light reflected from the object 20 may be incident to the second polarizer 107 through the first objective lens 109. The pattern reflection light may be converted into a linear polarized light by the second polarizer 107. The pattern reflection light may be again incident to the beam splitter 105.

The second divided light may be incident to the reflector 115 through the wavelength plate 111 and the second objective lens 113. The second divided light may be reflected from the reflector 115. The mirror reflection light may be incident to the beam splitter 105 through the wavelength plate 111 having the phase rotation angle (e.g., about 0°) in accordance with the operational parameters for the first metrology mode.

Thus, the interference signal between the pattern reflection light (i.e., the measurement signal) and the mirror reflection light (i.e., the reference signal) having the same polarization characteristic may be generated from the beam splitter 105. The image of the interference signal may be provided to the condenser 119 through the detector 117 having the polarization characteristic substantially the same as that of the first polarizer 103 during the first metrology mode. The image obtainer 121 may obtain the image.

Therefore, the image information based on the interference signal between the pattern reflection light (measurement signal) and the mirror reflection light (reference signal) may be obtained.

During the first metrology mode, the first polarizer 103 may have the S wave polarization characteristic. The wavelength plate 111 may have the phase delay of about 0° to provide the reference signal having the same polarization as the measurement signal with. The detector 117 may have the S wave polarization characteristic. In contrast, during the first metrology mode when the first polarizer 103 has the P wave polarization characteristic, the wavelength plate 111 may have the phase delay of about 0° and the detector 117 may have the P wave polarization characteristic.

At step S109, the analyzing unit 350 may analyze the pattern image of the object 20 in the first metrology mode.

At step S111, the second metrology mode may then be performed.

Thus, at step S111, the operational parameter may be changed in accordance with the second metrology mode. Above-mentioned steps may then be performed sequentially.

During the second metrology mode, the interference signal between the pattern reflection light (i.e., the measurement signal) and the mirror reflection light (i.e., the reference signal) having the vertical polarization characteristic may be generated from the beam splitter 105. When the operational parameters is set for the second metrology mode, the wavelength plate 111 may be provided with a rotation angle (e.g., about 22.5°) corresponding to the predetermined phase delay. The detector 117 may have the polarization characteristic substantially vertical to that of the first polarizer 103.

For example, when the first polarizer 103 has the S wave polarization characteristic during the second metrology mode, the wavelength plate 111 may be provided with the rotation angle of about 22.5°. The detector 117 may have the P wave polarization characteristic. In contrast, when the first polarizer 103 has the P wave polarization characteristic during the second metrology mode, the wavelength plate 111 may be provided with the rotation angle of about 22.5°. The detector 117 may have the S wave polarization characteristic.

At step S109, the analyzing unit 350 may analyze the pattern image of the object 20 during the second metrology mode. The analyzing unit 350 may gather and analyze the images of the first metrology mode and the second metrology mode to obtain a final pattern of the object 20.

In various embodiments, the pattern of the object 20 may be detected by vertically moving the transferring unit 420 using the driving unit 430. When the pattern of the object 20 is detected with position changes of the object 20 in the vertical direction, the pattern image may be more accurately measured.

Although the semiconductor integrated circuit may have the high aspect ratio and the patterns having the pitch less than the wavelength of the light, the pattern image of the object may be reliably obtained using the metrology apparatus. As a result, generations of pattern failures may be prevented so that yields of semiconductor devices may be improved.

The above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the invention and are intended to fall within the scope of the appended claims.

What is claimed is:

1. A metrology method comprising:
obtaining a pattern reflection light reflected from an object by irradiating a first divided light, which is generated by reflecting a linear polarized light and converting the reflected linear polarization light into a radial polarization light or an azimuthal polarization light, to the object;
obtaining a phase-controlled mirror reflection light reflected from a reflector by irradiating a second divided light, which is generated by transmitting the linear polarized light, to the reflector; and
obtaining a pattern of the object based on an interference signal between the pattern reflection light and the mirror reflection light.

2. The metrology method of claim 1, wherein a polarization characteristic of the mirror reflection light has substantially the same as that of the linear polarized light.

3. The metrology method of claim 1, wherein the interference signal has substantially the same polarization characteristic as that of the linear polarized light.

4. The metrology method of claim 1, further comprising emitting the linear polarized light from a coherent light source or an incoherent light source.

5. The metrology method of claim 1,
wherein the obtaining of the pattern of the object is performed based on the interference signal between the pattern reflection light and the mirror reflection light having substantially the same polarization characteristic during a first metrology mode, and
wherein the obtaining of the pattern is performed based on the interference signal between the pattern reflection light and the mirror reflection light having different polarization characteristics during a second metrology mode.

6. A metrology apparatus comprising:
a light source suitable for emitting a light;
a first polarizer suitable for generating a linear polarized light by polarizing the emitted light;
a beam splitter suitable for dividing the linear polarized light into a first divided light and a second divided light;
a second polarizer suitable for generating a pattern reflection light by converting the first divided light into a radial polarization light or an azimuthal polarization light and irradiating the radial or the azimuthal polarized first divided light to an object;
a reflector suitable for generating a mirror reflection light by reflecting the second divided light;
a wavelength plate suitable for controlling a phase of the mirror reflection light;
a detector suitable for changing a polarization characteristic of an interference signal between the pattern reflection light and the mirror reflection light; and
an image obtainer suitable for obtaining a pattern of the object based on the interference signal outputted from the detector.

7. The metrology apparatus of claim 6, wherein the light source comprises a coherent light source or an incoherent light source.

8. The metrology apparatus of claim 6, wherein the first polarizer comprises a variable polarizer having variable polarization characteristics.

9. The metrology apparatus of claim 6, wherein the beam splitter reflects the linear polarized light as the first divided light, and transmits the linear polarized light as the second divided light.

10. The metrology apparatus of claim 6, wherein the second polarizer comprises a radial polarizer.

11. The metrology apparatus of claim 6, wherein the wavelength plate comprises a quarter-wavelength plate.

12. The metrology apparatus of claim 6, wherein the wavelength plate controls the phase of the mirror reflection light so that the linear polarized light and the mirror reflection light have substantially the same polarization characteristic as each other.

13. The metrology apparatus of claim 6, wherein the detector has a polarization characteristic substantially the same as that of the linear polarized light.

14. The metrology apparatus of claim 6, wherein the detector comprises a variable polarizer having variable polarization characteristics.

15. A metrology system comprising:
a metrology apparatus suitable for:
obtaining a pattern reflection light reflected from an object by irradiating a first divided light, which is generated by reflecting a linear polarized light and converting the reflected linear polarization light into a radial polarization light or an azimuthal polarization light, to the object;
obtaining a phase-controlled mirror reflection light reflected from a reflector by irradiating a second divided light, which is generated by transmitting the linear polarized light, to the reflector; and
obtaining a pattern of the object based on an interference signal between the pattern reflection light and the mirror reflection light;
a stage suitable for moving the object; and
a user device suitable for controlling the metrology apparatus and the stage to measure the pattern of the object based on operational parameters.

16. The metrology system of claim 15, wherein a polarization characteristic of the mirror reflection light has substantially the same as that of the linear polarized light.

17. The metrology system of claim 15, wherein the metrology apparatus further emits the linear polarized light from a coherent light source or an incoherent light source.

18. The metrology system of claim 15,
wherein the metrology apparatus obtains the pattern of the object based on the interference signal between the pattern reflection light and the mirror reflection light having substantially the same polarization characteristic during a first metrology mode, and
wherein the metrology apparatus obtains the pattern of the object based on the interference signal between the pattern reflection light and the mirror reflection light having different polarization characteristics during a second metrology mode.

19. The metrology system of claim 15, wherein the metrology apparatus comprises:
a light source suitable for emitting a light;
a first polarizer suitable for generating the linear polarized light by polarizing the emitted light;
a beam splitter suitable for dividing the linear polarized light into the first divided light and the second divided light;
a second polarizer suitable for generating the pattern reflection light by converting the first divided light into a radial polarization light or an azimuthal polarization light and irradiating the radial or the azimuthal polarized first divided light to an object;
a reflector suitable for generating the mirror reflection light by reflecting the second divided light;
a wavelength plate suitable for controlling a phase of the mirror reflection light;
a detector suitable for changing a polarization characteristic of the interference signal between the pattern reflection light and the mirror reflection light; and
an image obtainer suitable for obtaining the pattern of the object based on the interference signal outputted from the detector.

20. The metrology system of claim 19, wherein the first polarizer comprises a variable polarizer having variable polarization characteristics.

21. The metrology system of claim 19, wherein the beam splitter reflects the linear polarized light as the first divided light, and transmits the linear polarized light as the second divided light.

22. The metrology system of claim 19, wherein the second polarizer comprises a radial polarizer.

23. The metrology system of claim 19, wherein the wavelength plate comprises a quarter-wavelength plate.

24. The metrology system of claim 19, wherein the wavelength plate controls the phase of the mirror reflection light so that the linear polarized light and the mirror reflection light have substantially the same polarization characteristic as each other.

25. The metrology system of claim 19, wherein the detector has a polarization characteristic substantially the same as that of the linear polarized light.

26. The metrology system of claim 19, wherein the detector comprises a variable polarizer having variable polarization characteristics.

27. The metrology system of claim 19, wherein the operational parameters comprise polarization characteristic of the first polarizer, the second polarizer and the detector, a phase delay of the wavelength plate and a power of the light source according to metrology modes.

* * * * *